(12) United States Patent
Fomenkov et al.

(10) Patent No.: US 12,369,244 B2
(45) Date of Patent: Jul. 22, 2025

(54) LASER SYSTEM FOR SOURCE MATERIAL CONDITIONING IN AN EUV LIGHT SOURCE

(71) Applicant: ASML Netherlands B.V., Veldhoven (NL)

(72) Inventors: Igor Vladimirovich Fomenkov, San Diego, CA (US); Yezheng Tao, San Diego, CA (US); Robert Jay Rafac, Encinitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 446 days.

(21) Appl. No.: 17/433,007

(22) PCT Filed: Mar. 2, 2020

(86) PCT No.: PCT/EP2020/055452
§ 371 (c)(1),
(2) Date: Aug. 23, 2021

(87) PCT Pub. No.: WO2020/178244
PCT Pub. Date: Sep. 10, 2020

(65) Prior Publication Data
US 2022/0192000 A1 Jun. 16, 2022

Related U.S. Application Data

(60) Provisional application No. 62/815,055, filed on Mar. 7, 2019.

(51) Int. Cl.
*H05G 2/00* (2006.01)
*G02F 1/01* (2006.01)
*G03F 7/00* (2006.01)

(52) U.S. Cl.
CPC .......... *H05G 2/008* (2013.01); *G02F 1/0128* (2013.01); *G03F 7/70033* (2013.01)

(58) Field of Classification Search
CPC .......... H05G 2/00; H05G 2/001; H05G 2/008; H05G 2/005; G03F 7/70033; G02F 1/0128

(Continued)

(56) References Cited

U.S. PATENT DOCUMENTS 7,598,509 B2   10/2009   Ershov et al.
9,426,872 B1*   8/2016   Riggs .................... H05G 2/008

(Continued)

FOREIGN PATENT DOCUMENTS

CN    104488362 A    4/2015
CN    105723811 A    6/2016

(Continued)

OTHER PUBLICATIONS

G.R.B.E. Römer et al., "Electro-optic and acousto-optic laser beam scanners," Physics Procedia 56, pp. 29-39 (2014).

(Continued)

*Primary Examiner* — Jason L McCormack
(74) *Attorney, Agent, or Firm* — DiBerardino McGovern IP Group LLC

(57) ABSTRACT

Disclosed is an apparatus and a method in which multiple, e.g., two or more pulses from a single laser source are applied to source material prior to application of a main ionizing pulse in which the multiple pulses are generated by a common laser source. The first pulse is directed towards the source material when the source material is at a first position and the second pulse is directed towards the source material when the source material is at a second position.

21 Claims, 6 Drawing Sheets

(58) Field of Classification Search
USPC .................................................... 250/504 R
See application file for complete search history.

(56) References Cited

U.S. PATENT DOCUMENTS

| | | | |
|---|---|---|---|
| 2005/0205811 A1* | 9/2005 | Partlo | ................. G03F 7/70033 |
| | | | 250/504 R |
| 2006/0249698 A1* | 11/2006 | Endo | .................. G03F 7/70916 |
| | | | 250/504 R |
| 2010/0220756 A1* | 9/2010 | Krzysztof | ............... H01S 3/235 |
| | | | 372/50.22 |
| 2013/0327963 A1* | 12/2013 | Lambert | ............ B23K 26/0676 |
| | | | 250/504 R |
| 2014/0264087 A1 | 9/2014 | Rafac et al. | |
| 2015/0083936 A1 | 3/2015 | Wehrens | |
| 2015/0146182 A1 | 5/2015 | Van Schoot et al. | |
| 2015/0342016 A1* | 11/2015 | Rafac | ..................... H05G 2/005 |
| | | | 250/504 R |
| 2016/0174351 A1* | 6/2016 | Zhang | ................... H05G 2/008 |
| | | | 250/504 R |
| 2016/0249698 A1* | 9/2016 | Berzowska | ........ A41D 13/1281 |
| | | | 2/69 |
| 2016/0320708 A1 | 11/2016 | Lu et al. | |
| 2017/0048958 A1* | 2/2017 | Riggs | ..................... H05G 2/003 |
| 2017/0048959 A1* | 2/2017 | Riggs | ..................... H05G 2/005 |
| 2017/0171955 A1* | 6/2017 | Ueno | ..................... H05H 15/00 |
| 2017/0171956 A1* | 6/2017 | Satoh | ........................ B01J 13/08 |
| 2018/0063935 A1 | 3/2018 | Tao et al. | |
| 2018/0279458 A1 | 9/2018 | Liebenberg et al. | |
| 2018/0317309 A1 | 11/2018 | Chang et al. | |
| 2019/0150267 A1 | 5/2019 | Liebenberg et al. | |

FOREIGN PATENT DOCUMENTS

| | | |
|---|---|---|
| CN | 106094441 A | 11/2016 |
| CN | 103843115 B | 2/2017 |
| CN | 206515569 U | 9/2017 |
| CN | 106444295 B | 5/2018 |
| CN | 108803247 A | 11/2018 |
| EP | 1492394 A2 | 12/2004 |
| EP | 1492394 A3 | 12/2009 |
| EP | 3042551 B1 | 8/2017 |
| JP | 5894002 B2 | 3/2016 |
| TW | 200742503 A | 11/2007 |
| TW | 201433030 A | 8/2014 |
| TW | 201434563 A | 9/2014 |
| WO | 2013049142 A2 | 4/2013 |
| WO | 2014089020 A1 | 6/2014 |
| WO | 2014110276 A1 | 7/2014 |

OTHER PUBLICATIONS

Christopher Smith, European International Searching Authority, International Search Report and Written Opinion, corresponding PCT Application No. PCT/EP2020/055452, mailed Jun. 19, 2020, 10 pages total.

* cited by examiner

LASER SYSTEM FOR SOURCE MATERIAL CONDITIONING IN AN EUV LIGHT SOURCE

CROSS REFERENCE TO RELATED APPLICATION

This application claims priority to U.S. Application No. 62/815,055, filed Mar. 7, 2019 and titled LASER SYSTEM FOR SOURCE MATERIAL CONDITIONING IN AN EUV LIGHT SOURCE, and which is incorporated herein in its entirety by reference.

FIELD

The present application relates to light sources which produce extreme ultraviolet light by excitation of a source material, in particular to systems using one or more laser pulses for the preparation and excitation of EUV source material.

BACKGROUND

Extreme ultraviolet ("EUV") light, for example, electromagnetic radiation having wavelengths of around 50 nm or less (also sometimes referred to as soft x-rays), and including light at a wavelength of about 13 nm, is used in photolithography processes to produce extremely small features in substrates, for example, silicon wafers Methods for generating EUV light include, but are not limited to, altering the physical state of the source material to a plasma state. The source material includes an element, for example, xenon, lithium, or tin, with an emission line in the EUV range. In one such method, often termed laser produced plasma ("LPP"), the required plasma is produced by irradiating a source material, for example, in the form of a droplet, stream, or cluster of source material, with an amplified light beam that can be referred to as a drive laser. For this process, the plasma is typically produced in a sealed vessel, for example, a vacuum chamber, and monitored using various types of metrology equipment.

$CO_2$ amplifiers and lasers, which output an amplified light beam at a wavelength of about 10600 nm, can present certain advantages as a drive laser for irradiating the source material in an LPP process. This may be especially true for certain source materials, for example, for materials containing tin. For example, one advantage is the ability to produce a relatively high conversion efficiency between the drive laser input power and the output EUV power.

In the EUV light source, EUV may be produced in a multiple-step process in which a droplet of source material en route to an irradiation site is first struck by one or more pulses that primarily condition the droplet in its original or in a modified form for subsequent phase conversion at the irradiation site. Conditioning in this context may include altering the shape of the droplet, e.g., flattening the droplet, or the redistribution of the droplet material, e.g., at least partially dispersing some of the droplet material as a mist. For example, a one or more pulses hits the droplet to modify the distribution of the source material and then a subsequent pulse hits the modified droplet to transform it to an EUV-emitting plasma. In some systems these pulses are provided by the same laser and in other systems the pulses are provided by separate lasers.

There is a need to make the systems that provide the multiple pulses more capably without unduly increasing system cost and complexity.

SUMMARY

The following presents a simplified summary of one or more embodiments in order to provide a basic understanding of the embodiments. This summary is not an extensive overview of all contemplated embodiments and is not intended to identify key or critical elements of all embodiments nor set limits on the scope of any or all embodiments. Its sole purpose is to present some concepts of one or more embodiments in a simplified form as a prelude to the more detailed description that is presented later.

According to one aspect of an embodiment there is disclosed an apparatus comprising a radiation source configured to generate a first pulse at a first time and a second pulse at a second time along a single axis for conditioning source material and an optical element arranged to receive the first pulse and the second pulse and configured to deliver the first pulse to a quantity of source material at the first time and to deliver the second pulse to the quantity of source material at the second time. The optical element may comprise a beam splitter, and the beam splitter may be a 50/50 beam splitter. The beam splitter may alternatively be a A/B beam splitter where A does not equal B. In various implementations, the beam splitter may be a polarization-dependent beam splitter. In various implementations, the beam splitter may be a dichroic beam splitter.

The optical element may comprise an optical deflector arranged to receive the first pulse and the second pulse and configured to have a first state in which the optical deflector deflects the first pulse to the quantity of source material at the first time and a second state in which the optical deflector deflects the second pulse to the quantity of source material at the second time. The optical deflector may comprise an electro-optic deflector. The optical deflector may comprise an acousto-optic deflector. The optical deflector may be additionally configured to change a parameter of at least one of the first pulse and the second pulse. The optical deflector may be additionally configured to change a parameter of the first pulse to a first value and to change the parameter of the second pulse to a second value different from the first value. The parameter may be integrated pulse energy. The parameter may be pulse width.

The radiation source may comprise a single laser configured to emit near infrared radiation, which may have a wavelength in a range of about 0.5 μm to about 1.4 μm. The radiation source may be configured such that a pulse characteristic of the first pulse has a first value and the pulse characteristic of the second pulse has a second value different from the first value. The pulse characteristic may be pulse width. The pulse characteristic may be integrated pulse energy. The first pulse may have a first integrated pulse energy and a first width and the second pulse may have a second integrated pulse energy and a second width.

According to another aspect of an embodiment there is disclosed apparatus comprising a radiation source configured to generate a first pulse and a second pulse along a single axis for conditioning source material and an optical element arranged to receive the first pulse and the second pulse and configured to deliver the first pulse along a first optical path to a quantity of source material at a first time and to deliver the second pulse along a second optical path to the quantity of source material at a second time. The optical element may comprise a beam splitter. The beam splitter may be a 50/50 beam splitter. The beam splitter may be a A/B beam splitter where A does not equal B.

The optical element may comprise an optical deflector arranged to receive the first pulse and the second pulse and configured to have a first deflection state in which the optical deflector deflects the first pulse along the first optical path to the quantity of source material at the first time and a second deflection state in which the optical deflector deflects the second pulse along the second optical path to the quantity of source material at the second time. The optical deflector may comprise an electro-optic deflector. The optical deflector may comprise an acousto-optic deflector. The optical deflector may be additionally configured to change a parameter of at least one of the first pulse and the second pulse. The optical deflector may be additionally configured to change a parameter of the first pulse to a first value and to change the parameter of the second pulse to a second value different from the first value. The parameter may be integrated pulse energy. The parameter may be pulse width. The first optical path may include first optics having a first focal length and the second optical path may include second optics having a second focal length different from the first focal length. The radiation source may comprise a single laser configured to emit near infrared radiation. The radiation source may comprise a single laser configured to emit radiation having a wavelength in a range of about 0.5 μm to about 1.4 μm. The radiation source may be configured such that a pulse characteristic of the first pulse has a first value and the pulse characteristic of the second pulse has a second value different from the first value. The pulse characteristic may be pulse width. The pulse characteristic may be integrated pulse energy. The first pulse may have a first integrated pulse energy and a first width and the second pulse may have a second integrated pulse energy and a second width.

According to another aspect of an embodiment there is disclosed a method of applying multiple pulses to a quantity of source material, the method comprising the steps of using a radiation source to generate a first pulse along a first path, directing the first pulse to irradiate the quantity of source material when the quantity of source material may be at a first position, using the radiation source to generate a second pulse along the first path, and directing the second pulse to irradiate the quantity of source material when the quantity of source material may be at a second position. The step of directing the first pulse and the step of directing the second pulse may be performed using a beam splitter. The beam splitter may be a 50/50 beam splitter. The beam splitter may be a A/B beam splitter where A does not equal B. The step of directing the first pulse and the step of directing the second pulse may be performed using an optical deflector. The step of directing the first pulse and the step of directing the second pulse are performed using an electro-optic deflector. The step of directing the first pulse and the step of directing the second pulse may be performed using an acousto-optic deflector. The step of directing the first pulse may comprise changing a parameter the first pulse. The step of directing the second pulse may comprise changing a parameter the second pulse. The step of directing the first pulse may comprise changing a parameter of the first pulse to a first value and the step of directing the second pulse may comprise changing the parameter of the second pulse to a second value different from the first value. The parameter may be integrated pulse energy. The parameter may be pulse width. The second position may be a position to which the source material has traveled after the quantity of source material has been struck by the first pulse. The steps of using the radiation source may comprise using a single laser configured to emit near infrared radiation. The steps of using the radiation source comprise using a single laser configured to emit radiation having a wavelength in a range of about 0.5 μm to about 1.4 μm. A pulse characteristic of the first pulse may have a first value and the pulse characteristic of the second pulse may have a second value different from the first value. The pulse characteristic may be pulse width. The pulse characteristic may be integrated pulse energy. The first pulse may have a first integrated pulse energy and a first width and the second pulse may have a second integrated pulse energy and a second width.

According to another aspect of an embodiment there is disclosed a method of applying multiple pulses to a quantity of source material, the method comprising the steps of (a) using a radiation source to generate a pulse along a first path, (b) directing the pulse to irradiate the quantity of source material, the source material being in motion and so traversing a number of positions; and (c) repeating steps (a) and (b) to irradiate the source material at a predetermined number of the positions.

Further embodiments, features, and advantages of the subject matter of the present disclosure, as well as the structure and operation of the various embodiments are described in detail below with reference to accompanying drawings.

Figure 1:
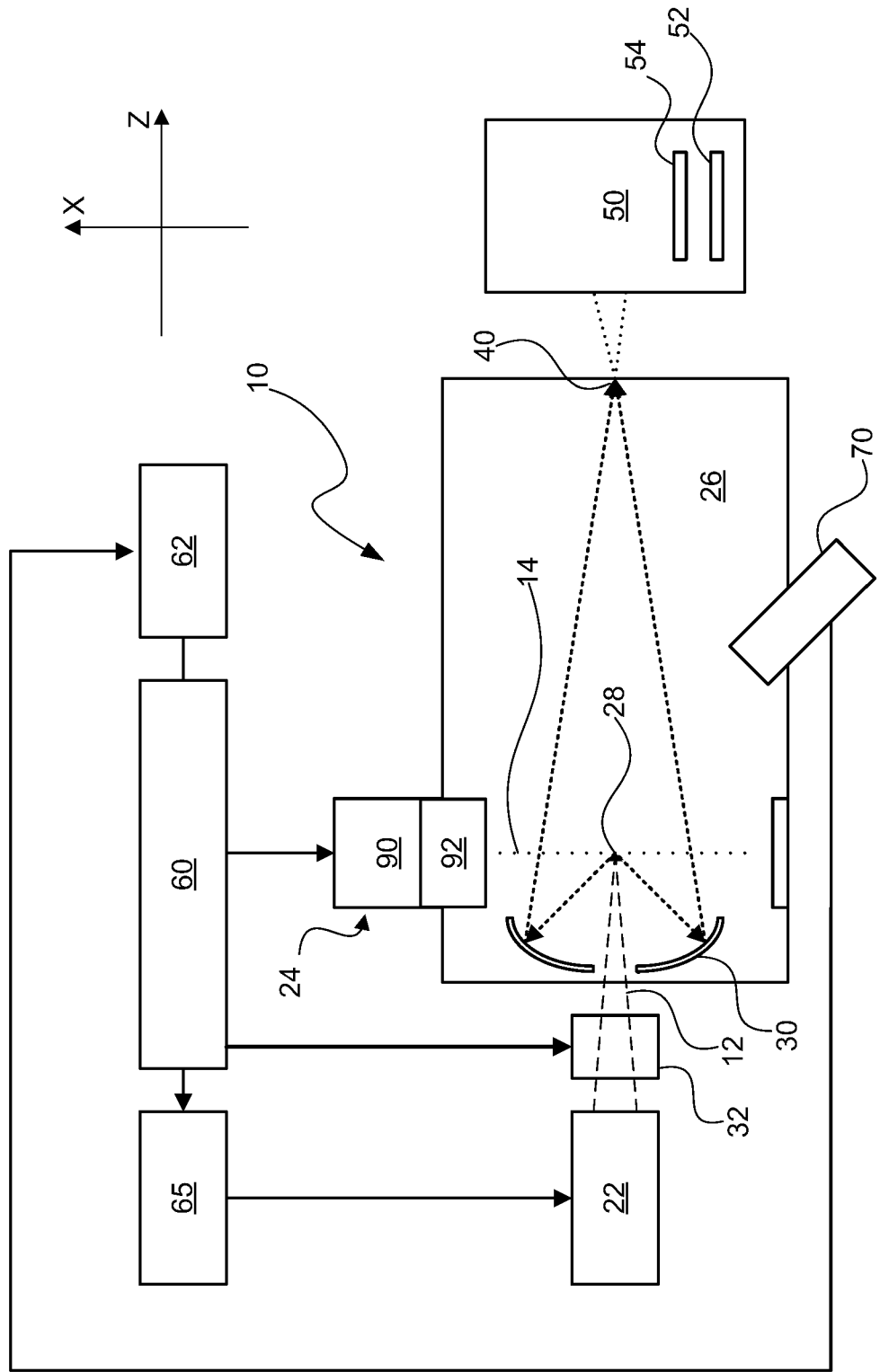
FIG. 1 is a schematic, not-to-scale view of an overall broad conception for a laser-produced plasma EUV radiation source system according to an aspect of an embodiment.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below.

With initial reference to FIG. 1 there is shown a schematic view of an exemplary EUV radiation source, e.g., a laser produced plasma EUV radiation source 10 according to one aspect of an embodiment of the present invention. As shown, the EUV radiation source 10 may include a pulsed or continuous laser source 22, which may for example be a pulsed gas discharge $CO_2$ laser source producing a beam 12 of radiation at a wavelength generally below 20 μm, for example, in the range of about 10.6 μm or to about 0.5 μm or less. The pulsed gas discharge $CO_2$ laser source may have DC or RF excitation operating at high power and at a high pulse repetition rate.

The EUV radiation source 10 also includes a target delivery system 24 for delivering source material in the form of liquid droplets or a continuous liquid stream. In this example, the source material is a liquid, but it could also be a solid or gas. The source material may be made up of tin or a tin compound, although other materials could be used. In the system depicted the source material delivery system 24 introduces droplets 14 of the source material into the interior of a vacuum chamber 26 to an irradiation region 28 where the source material may be irradiated to produce plasma. It should be noted that as used herein an irradiation region is a region where source material irradiation may occur, and is an irradiation region even at times when no irradiation is actually occurring. The EUV light source may also include a beam focusing and steering system 32 as will be explained in more detail below in conjunction with FIG. 2.

In the system shown, the components are arranged so that the droplets 14 travel substantially horizontally. The direction from the laser source 22 towards the irradiation region 28, that is, the nominal direction of propagation of the beam 12, may be taken as the Z axis. The path the droplets 14 take from the source material delivery system 24 to the irradiation region 28 may be taken as the X axis. The view of FIG. 1 is thus normal to the XZ plane. Also, while a system in which the droplets 14 travel substantially horizontally is depicted, it will be understood by one having ordinary skill in the art the other arrangements can be used in which the droplets travel vertically or at some angle with respect to gravity between and including 90 degrees (horizontal) and 0 degrees (vertical).

The EUV radiation source 10 may also include an EUV light source controller system 60, which may also include a laser firing control system 65, along with the beam steering system 32. The EUV radiation source 10 may also include a detector such as a droplet position detection system which may include one or more droplet imagers 70 that generate an output indicative of the absolute or relative position of a droplet, e.g., relative to the irradiation region 28, and provide this output to a target position detection feedback system 62.

The droplet position detection feedback system 62 may use the output of the droplet imager 70 to compute a droplet position and trajectory, from which a droplet position error can be computed. The droplet position error can be computed on a droplet-by-droplet basis, or on average, or on some other basis. The droplet position error may then be provided as an input to the light source controller 60. In response, the light source controller 60 can generate a control signal such as a laser position, direction, or timing correction signal and provide this control signal to the laser beam steering system 32. The laser beam steering system 32 can use the control signal to change the location and/or focal power of the laser beam focal spot within the chamber 26. The laser beam steering system 32 can also use the control signal to change the geometry of the interaction of the beam 12 and the droplet 14. For example, the beam 12 can be made to strike the droplet 14 off-center or at an angle of incidence other than directly head-on.

As shown in FIG. 1, the source material delivery system 24 may include a source material delivery control system 90. The source material delivery control system 90 is operable in response to a signal, for example, the droplet position error described above, or some quantity derived from the droplet position error provided by the system controller 60, to adjust paths of the source material through the irradiation region 28. This may be accomplished, for example, by repositioning the point at which a source material delivery mechanism 92 releases the droplets 14. The droplet release point may be repositioned, for example, by tilting the target delivery mechanism 92 or by shifting the target delivery mechanism 92. The source material delivery mechanism 92 extends into the chamber 26 and is preferably externally supplied with source material and connected to a gas source to place the source material in the source material delivery mechanism 92 under pressure.

Continuing with FIG. 1, the radiation source 10 may also include one or more optical elements. In the following discussion, a collector 30 is used as an example of such an optical element, but the discussion applies to other optical elements as well. The collector 30 may be a normal incidence reflector, for example, implemented as a multi-layer mirror (MLM), for example using alternating layers of molybdenum and silicon, with additional thin barrier layers, for example $B_4C$, ZrC, $Si_3N_4$ or C, deposited at each interface to effectively block thermally-induced interlayer diffusion. Other substrate materials, such as aluminum (Al) or silicon (Si), can also be used. The collector 30 may be in the form of a prolate ellipsoid, with a central aperture to allow the laser radiation 12 to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EUV radiation may be output from the EUV radiation source 10 and input to, e.g., an integrated circuit lithography scanner or stepper 50 which uses the radiation, for example, to process a silicon wafer work piece 52 in a known manner using a reticle or mask 54. The mask 54 may be transmissive or reflective. For EUV applications the mask 54 is generally reflective. The silicon wafer work piece 52 is then additionally processed in a known manner to obtain an integrated circuit device.

Figure 2:
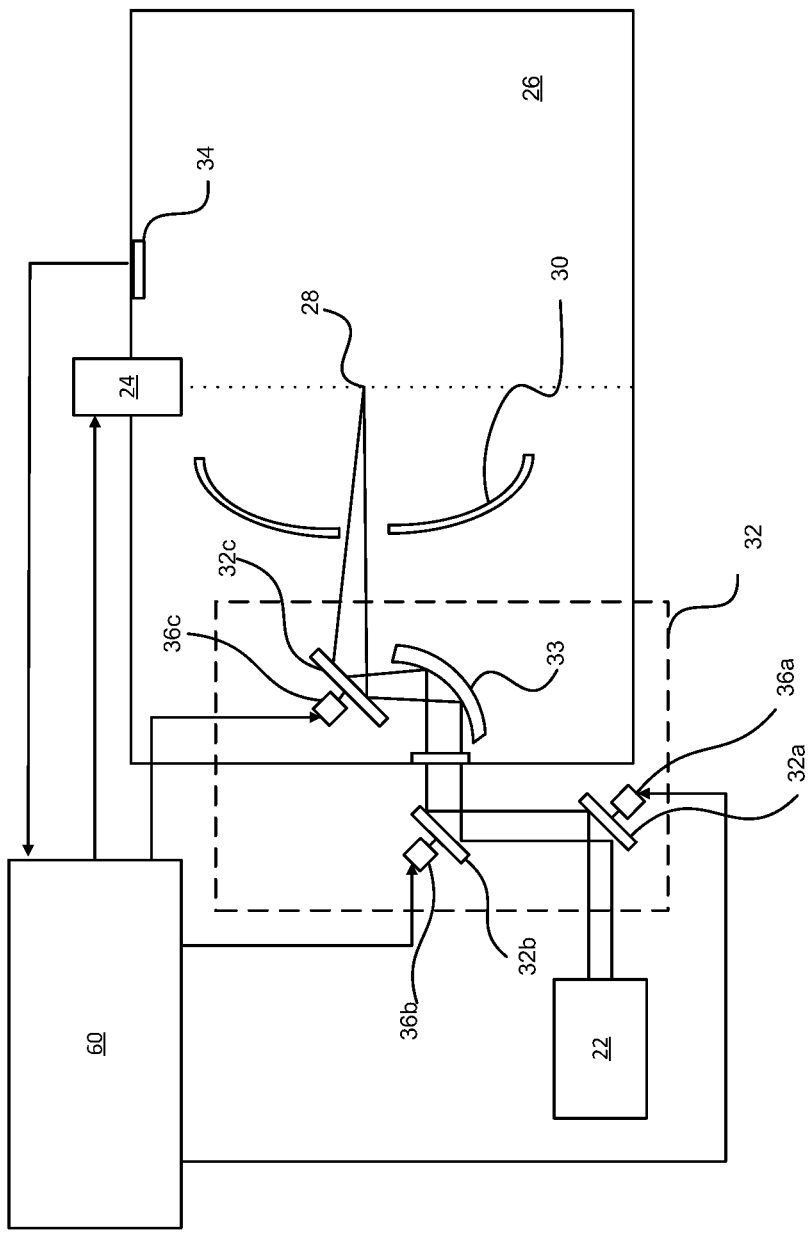
FIG. 2 is a schematic, not-to-scale view of a portion of the system of FIG. 1 according to an aspect of an embodiment.

Continuing to FIG. 2, it can be seen that the beam steering system 32 may include one or more steering mirrors 32a, 32b, and 32c. Although three mirrors are shown, it is to be appreciated that more than three or as few as one steering mirror may be employed to steer the beam. Moreover, although mirrors are shown, it is to be appreciated that other optics such as prisms may be used and that one or more of the steering optics may be positioned inside the chamber 26. See for example U.S. Pat. No. 7,598,509 issued Oct. 6, 2009, and titled "Laser Produced Plasma EUV Light Source," the entire contents of which are hereby incorporated by reference herein. For the embodiment shown, each of the steering mirrors 32a, 32b, and 32c may be mounted on a respective tip-tilt actuator 36a, 36b, and 36c which may move each of the steering mirrors 32a, 32b, and 32c independently in either or both of two dimensions.

Figure 3A:
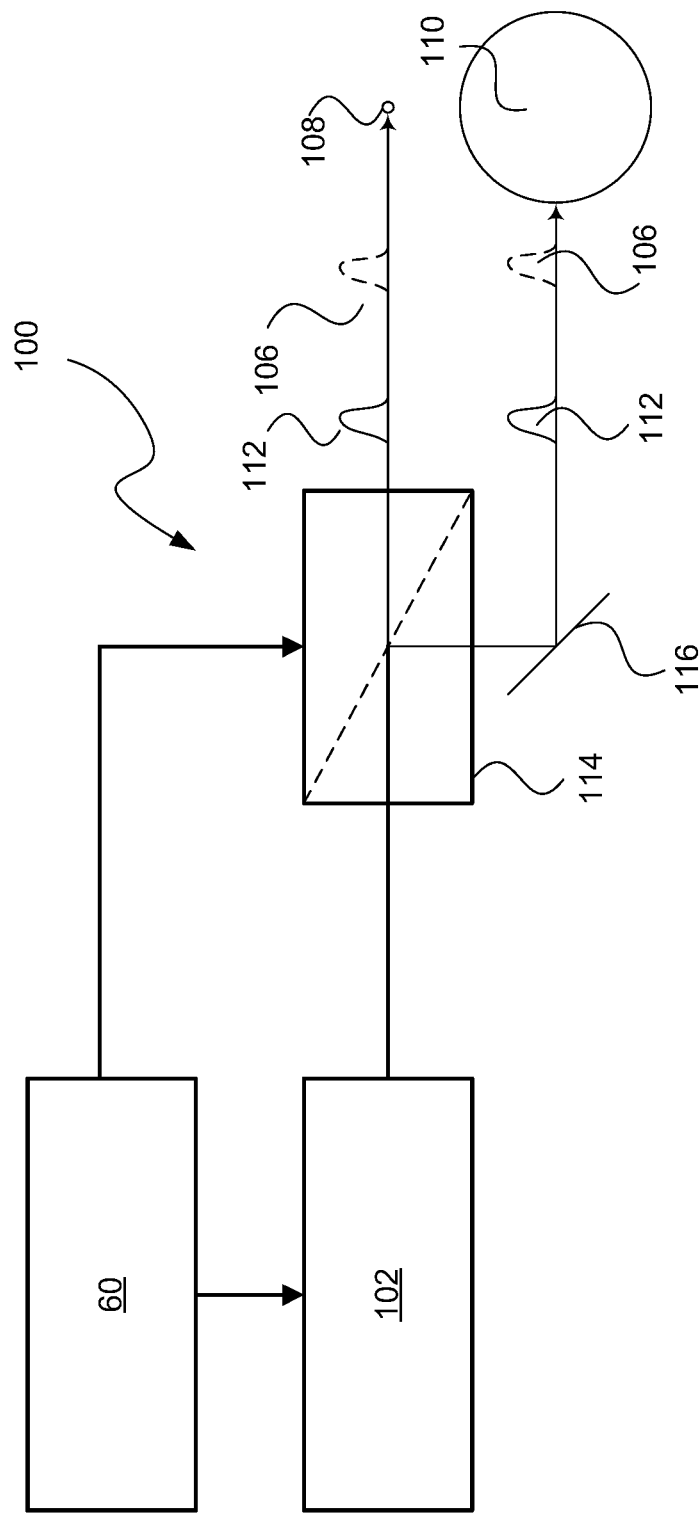
FIG. 3A is a diagram showing a pulse delivery system according to an aspect of an embodiment.

FIG. 3A is a not-to-scale schematic diagram of an EUV pulse system 100 according to one aspect of an embodiment. The EUV pulse system is arranged to be able to supply pulses to the droplets of source material 14 (FIG. 1). EUV pulse system 100 includes, among other features, a radiation source 102 capable of producing a pulse 106. The pulse 106 propagates into a chamber 26 (FIG. 1) where it strikes a droplet 108 of source material.

In the example shown, the source material (e.g., droplets 14 shown in FIG. 1) is originally in the form of a droplet 108 in a stream of droplets released by the target delivery mechanism 92 (FIG. 1). If the source material has already been subjected to one or more pulses then it may no longer be in a droplet form. For the sake of clarity, the source material before it is subjected to any pulse is referred to herein as a droplet and source material after it has been subjected to any pulse is referred to herein as a target. According to an aspect of an embodiment the pulse 106 is a first pulse that pre-conditions the source material by, for example, changing the geometric distribution of the source material, for example, from the droplet 108 to a conditioned target form 110 such as a disk, cloud, etc. This conditioned target form 110 is then struck by a second pulse 112 that further conditions the source material for phase conversion by a later pulse.

Also, the term "pre-pulse" is sometimes used to describe a pulse having the primary purpose of conditioning the target material and the term "main pulse" is sometimes used to describe the final pulse having the primary purpose of creating a plasma from the source material. It is possible, however, in some applications that the purposes of the pulses will not be so separate and distinct. Therefore, for the sake of clarity herein, reference will simply be made to pulses that are distinguished by their relative order.

The system of FIG. 3A also includes an optical element for directing a beam including a beam splitter 114. The beam splitter arrangement is configured to send the same beam/pulses to two locations. Part of pulse 106 will strike the droplet 108. The other part of the split pulse 106 will travel a path including a mirror 116 and will not strike the source material. Once the modified droplet, i.e., target 110 reaches the position shown a second pulse 112 is fired. Part of pulse 106 will travel a path including a mirror 116 and will strike the target 110. The other part of the split pulse 112 will not strike the source material. The beam splitter 114 may be a 50/50 beam splitter, that is, a beam splitter that splits the beam into two beams of equal energy, or can split the beam into two beams of unequal energy, that is, in the ratio A/B where A does not equal B, in effect an A/B beam splitter, depending on whether the amount of energy one wishes to apply to the droplet differs depending on droplet position and condition. This may avoid a need for making the energy of the pulses different by changing the pulse width or instantaneous power. The energy input to the beam splitter can be the same for both pulses but the two outputs would have different energies. This arrangement can also be extended to a multiplicity of beam splitters if more than two pulses are needed.

Figure 3B:
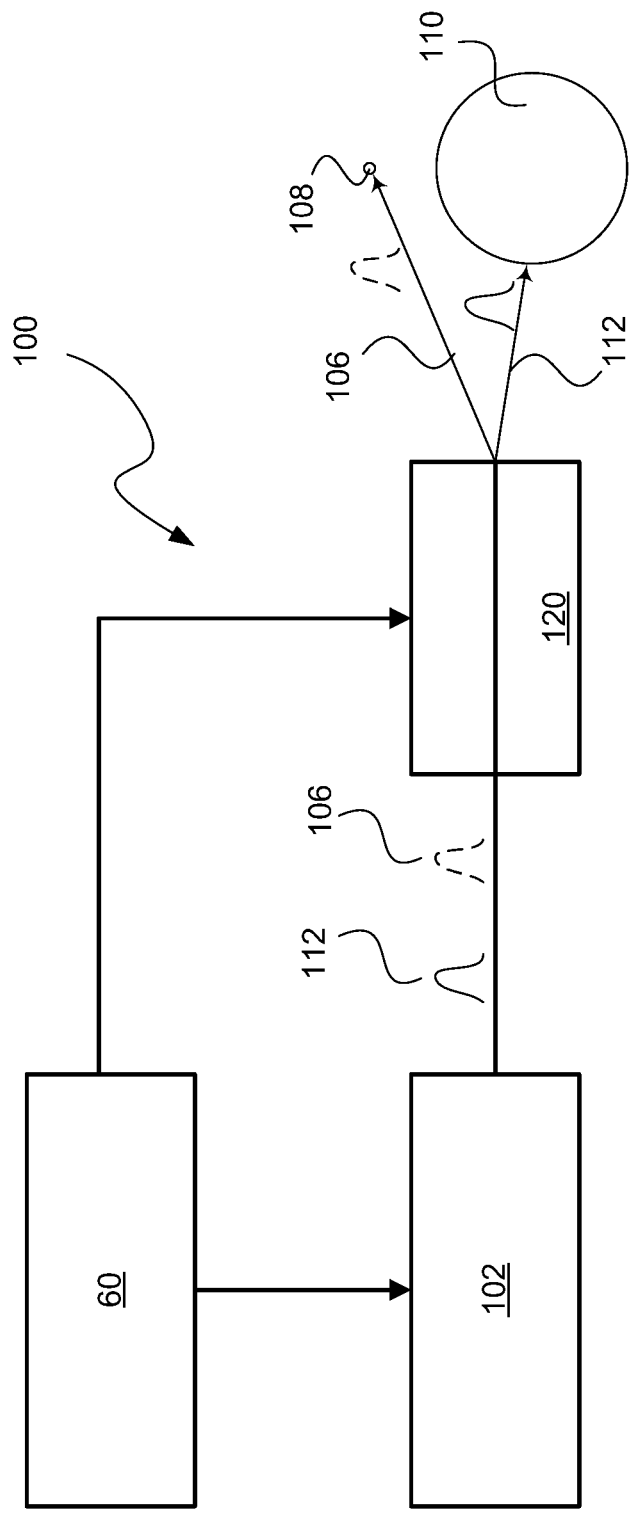
FIG. 3B is a diagram showing a pulse delivery system according to an aspect of an embodiment.

FIG. 3B is a not-to-scale schematic diagram of an EUV pulse system 100 according to another aspect of an embodiment. As above, the EUV pulse system is arranged to be able to supply pulses to the source material (e.g., to droplets 14 shown in FIG. 1). EUV pulse system 100 includes, among other features, a radiation source 102 capable of producing a pulse 106. The pulse 106 propagates into a chamber 26 (FIG. 1) where it strikes a droplet 108 of source material. The system of FIG. 3B also includes an optical element for directing a beam including an optical deflector module 120. This optical deflector module 120 is arranged on the optical path of laser radiation from the radiation source 102 and can deflect the radiation so that it travels to multiple positions. In the arrangement shown the optical deflector module 120 is arranged to have a first state in which it deflects the first pulse 106 so that the first pulse 106 strikes the droplet 108 and a second state in which it deflects the second pulse 112 so that the second pulse 112 strikes the target 110 which resulted from the interaction of the first pulse 106 and the droplet 108. The optical deflector module 120 may be, for example, an electro-optical deflector or an acoustic-optical deflector. The optical deflector module 120 operates under the control of the control unit 60 as shown, as does the radiation source 102. This arrangement has the advantage that no pulse energy is wasted, but it is more complex.

The use of the optical deflector module in conjunction with the radiation source 102 permits the same radiation source to produce both pulses along the same optical path. This thus provides the flexibility of permitting multiple pulses with minimal additional complexity or cost.

As mentioned, the optical deflector module 120 may be, for example, an electro-optical deflector or an acoustic optical deflector. Details concerning such devices can be found, for example, in G.R.B.E. Römer et al. "Electro-optic and acousto-optic laser beam scanners", Physics Procedia 56 (2014), pp. 29-39. For some applications and types of optical deflectors it may be desirable to use additional optical elements, for example, to provide for different focal lengths for the optical path for the first pulse with respect to the second pulse or different beam widths.

The optical deflector module 120 may also be configured to be an actuator for controlling the integrated pulse energy, or the pulse width, or both. In such an arrangement the pulses put out by the radiation source 102 would have the same integrated pulse energy and width. The optical defector module 120 would then not only deflect the pulse but also control a characteristic of the pulse. For example, the optical deflector module 120 could attenuate the pulse to control integrated pulse energy. The optical deflector module 120 could alternatively or additionally trim the pulse to control pulse width. This control could be different for sequential pulses so that the optical deflector module 120 could receive a first pulse originally having a certain integrated pulse energy and width and alter one or both of those parameters, and then optical deflector module 120 could receive a second pulse originally having the same integrated pulse energy and width as the first pulse and alter one or both of those parameters differently than for the first pulse. It will also be apparent to one of ordinary skill in the art that an optical deflector having these capabilities could also be used in conjunction with a radiation source capable of modifying pulse parameters pulse-to-pulse to provide two levels of control of the parameters.

According to an aspect of an embodiment, the radiation source 102 is configured as a near infrared (about 1 micrometer wavelength) laser, that is, to emit radiation having a wavelength in a range of about 0.75 µm to about 1.4 µm. This could be a $CO_2$ laser configured to emit radiation having a wavelength on this range, or any other type of laser so configured and which is capable of emitting pulse having a high enough energy, for example, in a range about 1 mJ to about 100 mJ in about 1 ns to about 50 ns. Examples of other lasers include lasers using other materials such as Nd:YAG lasers, and lasers in other forms such as thin-disk lasers and fiber lasers. It will be understood, however, that other wavelengths may be used. The radiation source 102 may also be configured so that the first pulse 106 and the second pulse 112 have different power levels, shapes, etc.

Figure 4:
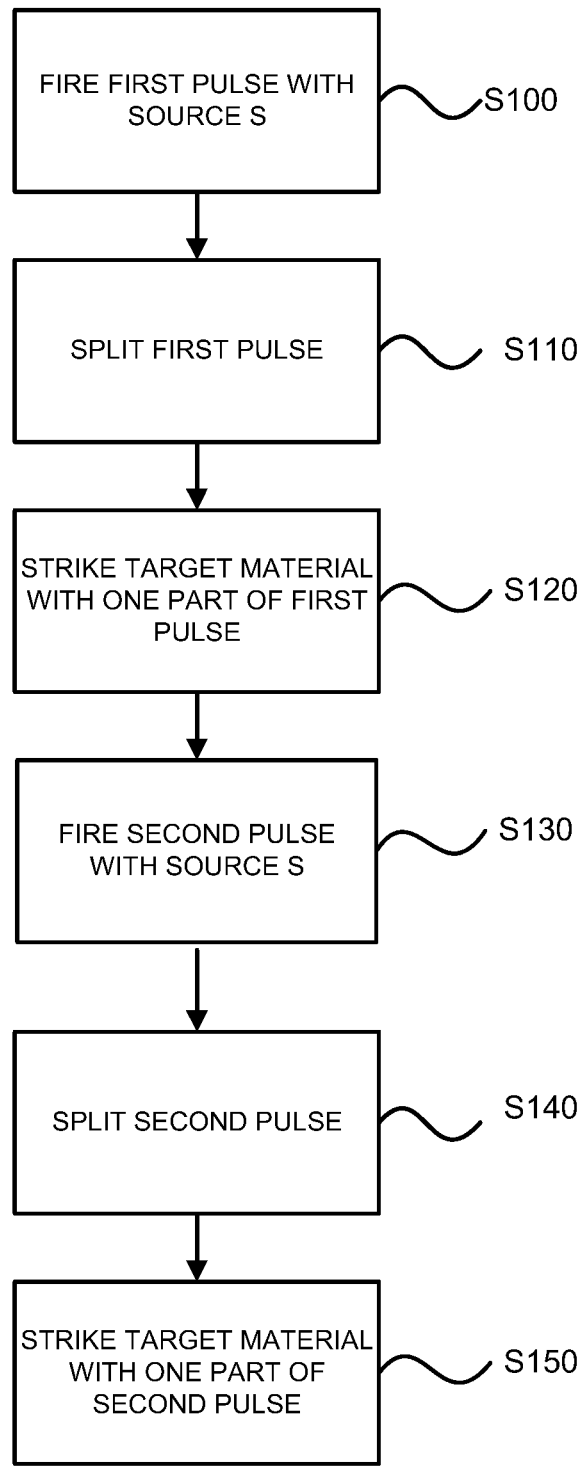
FIG. 4 is a flowchart showing a method of supplying multiple pulses to source material according to one aspect of an embodiment.

FIG. 4 is a flowchart showing a method of supplying multiple pulses to source material according to an aspect of an embodiment. In step S100 a first pulse is fired using a source S. In a step S110 a beam splitter is used to split the first pulse. A step S120 the source material is struck with one part of the first pulse. In a step S130 a second pulse is fired by the source S. In a step S140 the second pulse is split. In step S150 the source material is struck with one part of the split second pulse.

Figure 5:
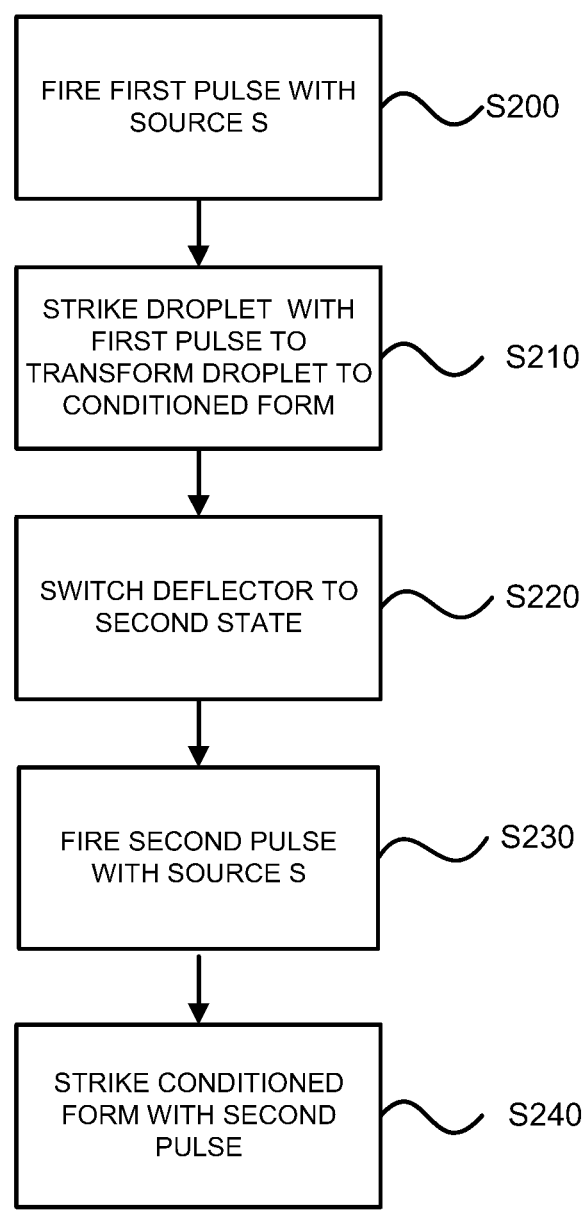
FIG. 5 is a flowchart showing a mode of operation of a pulse delivery system according to one aspect of an embodiment.

With reference to the flowchart of FIG. 5 there is disclosed a method of using a single radiation source to deliver two sequential pulses according to an aspect of an embodiment. Again it will be understood that the optical deflector used in the method is in a first state in which it will deflect an input pulse towards the position of a droplet before the described steps. In a step S200 a radiation source S is operated to fire a first pulse. In a step S210 the target, an unconditioned droplet of source material, is struck with the first pulse. In a step S220 the optical deflector is switched to a second state in which it will deflect an input pulse towards the position of the conditioned source material. In a step S230 the radiation source S is operated to fire a second pulse. In a step S240 the second pre pulse strikes the conditioned form to further condition it for later phase transition using a main pulse. Again, certain aspects of this sequence are arbitrary. The salient features in the example are that one radiation source is used to generate both the first pulse and the second pulse and that the optical deflector is switched between deflection states between the first pulse and the second pulse.

As an example, the first pulse may irradiate a small droplet (about 30 micrometers) which modifies the shape of the droplet to a disk shape about 500 micrometers in diameter. The second pulse irradiates the disk at a time when the disk has travelled about 300 micrometers from the original droplet position, with a delay between the pulses being about 3 microseconds.

Thus through the provision of the systems disclosed herein the optical delivery of two or more laser pulses may be optimized and simplified with the possibility of changing the size, shape, focus position, and direction of the pulses. Use of one laser instead of two makes it possible to make the system more compact and easier to integrate, as well as less expensive to implement.

The present disclosure is made with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. For example, the control module functions can be divided among several systems or performed at least in part by an overall control system.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

Other aspects of the invention are set out in the following numbered clauses.

1. Apparatus comprising:
    a radiation source configured to generate a first pulse at a first time and a second pulse at a second time along a single axis for conditioning source material; and
    an optical element arranged to receive the first pulse and the second pulse and configured to deliver the first pulse to a quantity of source material at the first time and to deliver the second pulse to the quantity of source material at a second time.
2. Apparatus as in clause 1 wherein the optical element comprises a beam splitter.
3. Apparatus as in clause 2 in which the beam splitter is a 50/50 beam splitter.
4. Apparatus as in clause 2 in which the beam splitter is a A/B beam splitter where A does not equal B.
5. Apparatus as in clause 1 wherein the optical element comprises an optical deflector arranged to receive the first pulse and the second pulse and configured to have a first state in which the optical deflector deflects the first pulse to the quantity of source material at the first time and a second state in which the optical deflector deflects the second pulse to the quantity of source material at the second time.
6. Apparatus as in clause 5 wherein the optical deflector comprises an electro-optic deflector.
7. Apparatus as in clause 5 wherein the optical deflector comprises an acousto-optic deflector.
8. Apparatus as in any one of clauses 5, 6, or 7 wherein the optical deflector is additionally configured to change a parameter of at least one of the first pulse and the second pulse.
9. Apparatus as in clause 8 wherein the optical deflector is additionally configured to change a parameter of the first pulse to a first value and to change the parameter of the second pulse to a second value different from the first value.
10. Apparatus as in clause 8 or 9 wherein the parameter is integrated pulse energy.
11. Apparatus as in clause 8 or 9 wherein the parameter is pulse width.
12. Apparatus as in any one of clauses 1-11 wherein the radiation source comprises a single laser configured to emit near infrared radiation.
13. Apparatus as in any one of clauses 1-12 wherein the radiation source comprises a single laser configured to emit radiation having a wavelength in a range of about 0.5 μm to about 1.4 μm.
14. Apparatus as in any one of clauses 1-12 wherein the radiation source is configured such that a pulse characteristic of the first pulse has a first value and the pulse characteristic of the second pulse has a second value different from the first value.
15. Apparatus as in clause 14 wherein the pulse characteristic is pulse width.
16. Apparatus as in clause 14 wherein the pulse characteristic is integrated pulse energy.
17. Apparatus as in clause 14 wherein the first pulse has a first integrated pulse energy and a first width and the second pulse has a second integrated pulse energy and a second width.
18. Apparatus comprising:
    a radiation source configured to generate a first pulse and a second pulse along a single axis for conditioning source material; and an optical element arranged to receive the first pulse and the second pulse and configured to deliver the first pulse along a first optical path to a quantity of source material at a first time and to deliver the second pulse along a second optical path to the quantity of source material at a second time.

19. Apparatus as in clause 18 wherein the optical element comprises a beam splitter.

20. Apparatus as in clause 19 in which the beam splitter is one or more of: a 50/50 beam splitter or an A/B beam splitter where A does not equal B.

21. Apparatus as in clause 18, wherein the optical element is arranged so that the first and second optical paths intersect different positions of a moving source material.

22. Apparatus as in clause 19 wherein the optical element comprises an optical deflector arranged to receive the first pulse and the second pulse and configured to have a first deflection state in which the optical deflector deflects the first pulse along the first optical path to the quantity of source material at the first time and a second deflection state in which the optical deflector deflects the second pulse along the second optical path to the quantity of source material at the second time.

23. Apparatus as in clause 22 wherein the optical deflector comprises an electro-optic deflector.

24. Apparatus as in clause 22 wherein the optical deflector comprises an acousto-optic deflector.

25. Apparatus as in any one of clauses 22, 23, or 24 wherein the optical deflector is additionally configured to change a parameter of at least one of the first pulse and the second pulse.

26. Apparatus as in clause 25 wherein the optical deflector is additionally configured to change a parameter of the first pulse to a first value and to change the parameter of the second pulse to a second value different from the first value.

27. Apparatus as in clause 25 or 26 wherein the parameter is integrated pulse energy.

28. Apparatus as in clause 25 or 26 wherein the parameter is pulse width.

29. Apparatus as in any one of clauses 18-28 wherein the first optical path includes first optics having a first focal length and the second optical path includes second optics having a second focal length different from the first focal length.

30. Apparatus as in any one of clauses 18-28 wherein the radiation source comprises a single laser configured to emit near infrared radiation.

31. Apparatus as in any one of clauses 18-28 wherein the radiation source comprises a single laser configured to emit radiation having a wavelength in a range of about 0.5 μm to about 1.4 μm.

32. Apparatus as in any one of clauses 18-28 wherein the radiation source is configured such that a pulse characteristic of the first pulse has a first value and the pulse characteristic of the second pulse has a second value different from the first value.

33. Apparatus as in clause 32 wherein the pulse characteristic is pulse width.

34. Apparatus as in clause 32 wherein the pulse characteristic is integrated pulse energy.

35. Apparatus as in clause 18 wherein the first pulse has a first integrated pulse energy and a first width and the second pulse has a second integrated pulse energy and a second width.

36. A method of applying multiple pulses to a quantity of source material, the method comprising the steps of:
    using a radiation source to generate a first pulse along a first path;
    directing the first pulse to irradiate the quantity of source material when the quantity of source material is at a first position;
    using the radiation source to generate a second pulse along the first path; and
    directing the second pulse to irradiate the quantity of source material when the quantity of source material is at a second position.

37. A method as in clause 36 wherein the step of directing the first pulse and the step of directing the second pulse are performed using a beam splitter.

38. A method as in clause 36 in which the beam splitter is a 50/50 beam splitter.

39. A method as in clause 38 in which the beam splitter is a A/B beam splitter where A does not equal B.

40. A method as in clause 36 wherein the step of directing the first pulse and the step of directing the second pulse are performed using an optical deflector.

41. A method as in clause 36 wherein the step of directing the first pulse and the step of directing the second pulse are performed using an electro-optic deflector.

42. A method as in clause 36 wherein the step of directing the first pulse and the step of directing the second pulse are performed using an acousto-optic deflector.

43. A method as in any of clauses 36-42 wherein the step of directing the first pulse comprises changing a parameter the first pulse.

44. A method as in any of clauses 36-43 wherein the step of directing the second pulse comprises changing a parameter the second pulse.

45. A method as in any of clause 36-44 wherein the step of directing the first pulse comprises changing a parameter of the first pulse to a first value and the step of directing the second pulse comprises changing the parameter of the second pulse to a second value different from the first value.

46. A method as in any of clauses 43, 44, or 45 wherein the parameter is integrated pulse energy.

47. A method as in any of clauses 43, 44, or 45 wherein the parameter is pulse width.

48. A method as in any one of clauses 36-48 wherein the second position is a position to which the source material has traveled after the quantity of source material has been struck by the first pulse.

49. A method as in any one of clauses 36-48 wherein the steps of using the radiation source comprise using a single laser configured to emit near infrared radiation.

50. A method as in any one of clauses 36-48 wherein the steps of using the radiation source comprise using a single laser configured to emit radiation having a wavelength in a range of about 0.5 μm to about 1.4 μm.

51. A method as in any one of clauses 36-48 wherein a pulse characteristic of the first pulse has a first value and the pulse characteristic of the second pulse has a second value different from the first value.

52. A method as in clause 51 wherein the pulse characteristic is pulse width.

53. A method as in clause 51 wherein the pulse characteristic is integrated pulse energy.

54. A method as in clause 51 wherein the first pulse has a first integrated pulse energy and a first width and the second pulse has a second integrated pulse energy and a second width.

55. A method of applying multiple pulses to a quantity of source material, the method comprising the steps of:
(a) using a radiation source to generate a pulse along a first path;
(b) directing the pulse to irradiate the quantity of source material, the source material being in motion and so traversing a number of positions; and
(c) repeating steps (a) and (b) to irradiate the source material at a predetermined number of the positions.

The invention claimed is:

1. Apparatus comprising:
a radiation source configured to generate a first pulse and a second pulse along a single axis; and
an optical element arranged to receive the first pulse and the second pulse and configured to:
deliver the first pulse along a first optical path to a droplet of source material at a first time and a first location to create a conditioned target of source material from the droplet of source material, and
deliver the second pulse along a second optical path spatially different from the first optical path to the conditioned target of source material at a second time and a second location distinct from the first location,
wherein the optical element comprises an optical deflector arranged to receive the first pulse and the second pulse and configured to have a first deflection state in which the optical deflector deflects the first pulse along the first optical path to the droplet of source material at the first time and a second deflection state in which the optical deflector deflects the second pulse along the second optical path to the droplet of source material at the second time.

2. Apparatus as in claim 1 wherein the radiation source is configured to generate the first pulse at the first time and the second pulse at the second time.

3. Apparatus as in claim 1 wherein the optical element comprises a beam splitter.

4. Apparatus as in claim 3 wherein the beam splitter is a 50/50 beam splitter or an A/B beam splitter where A does not equal B.

5. Apparatus as in claim 1 wherein the source material travels along a trajectory and wherein the optical element is arranged so that the first and second optical paths intersect different positions along the trajectory.

6. Apparatus as in claim 1 wherein the optical deflector comprises an acousto-optic deflector.

7. Apparatus as in claim 1 wherein the optical deflector is additionally configured to change a parameter of at least one of the first pulse and the second pulse.

8. Apparatus as in claim 7 wherein the optical deflector is additionally configured to change a parameter of the first pulse to a first value and to change the parameter of the second pulse to a second value different from the first value.

9. Apparatus as in claim 7 wherein the parameter is integrated pulse energy.

10. Apparatus as in claim 7 wherein the parameter is pulse width.

11. Apparatus as in claim 1 wherein the first optical path includes first optics having a first focal length and the second optical path includes second optics having a second focal length different from the first focal length.

12. Apparatus as in claim 1 wherein the radiation source is configured to emit near infrared radiation.

13. Apparatus as in claim 1 wherein the radiation source is configured such that a pulse characteristic of the first pulse has a first value and the pulse characteristic of the second pulse has a second value different from the first value.

14. Apparatus as in claim 13 wherein the pulse characteristic is pulse width.

15. Apparatus as in claim 13 wherein the pulse characteristic is integrated pulse energy.

16. Apparatus comprising:
a radiation source configured to generate a first pulse at a first time and a second pulse at a second time; and
an optical element arranged to receive the first pulse and the second pulse and configured to deliver the first pulse along a first optical path to a droplet of source material at a first time to create a conditioned target of source material from the droplet of source material and to deliver the second pulse along a second optical path to the conditioned target of source material at a second time;
wherein the optical element comprises an optical deflector arranged to receive the first pulse and the second pulse and configured to have a first deflection state in which the optical deflector deflects the first pulse along the first optical path to the droplet of source material at the first time and a second deflection state in which the optical deflector deflects the second pulse along the second optical path to the droplet of source material at the second time, and
wherein the second optical path is spatially different from the first optical path.

17. Apparatus as in claim 16 wherein the optical deflector comprises an acousto-optic deflector.

18. Apparatus as in claim 16 wherein the optical deflector is additionally configured to change a parameter of at least one of the first pulse and the second pulse.

19. Apparatus as in claim 18 wherein the optical deflector is additionally configured to change a parameter of the first pulse to a first value and to change the parameter of the second pulse to a second value different from the first value.

20. Apparatus as in claim 18 wherein the parameter is integrated pulse energy.

21. Apparatus as in claim 18 wherein the parameter is pulse width.

* * * * *